US006798256B1

(12) United States Patent
Hazucha et al.

(10) Patent No.: US 6,798,256 B1
(45) Date of Patent: Sep. 28, 2004

(54) RESONANT BUFFER APPARATUS, METHOD, AND SYSTEM

(75) Inventors: Peter Hazucha, Beaverton, OR (US); Gerhard Schrom, Hillsboro, OR (US); Jae-Hong Hahn, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/426,606

(22) Filed: Apr. 30, 2003

(51) Int. Cl.[7] ............................................... H03B 1/00
(52) U.S. Cl. ..................... 327/111; 327/108; 326/82; 326/87
(58) Field of Search ................ 327/178, 180, 327/309, 313, 314, 108–112, 170; 326/81, 82, 83, 85, 87, 88

(56) References Cited

U.S. PATENT DOCUMENTS 4,492,881 A * 1/1985 Anderson et al. ............. 326/89
4,862,018 A * 8/1989 Taylor et al. ................. 326/27
4,873,460 A * 10/1989 Rippel ......................... 327/437
6,172,550 B1 * 1/2001 Gold et al. ................... 327/366
6,201,420 B1 * 3/2001 Harvey ........................ 327/109
6,285,236 B1 * 9/2001 Stephens ..................... 327/391

OTHER PUBLICATIONS

"High Efficiency Synchronous Step–Down Switching Regulator", *Linear Tehcnology*, LTC 1735, (1998),pp. 1–32.

Flatness, Randy, et al., "New LTC 1435–LTC1439 DC/DC Controllers Feature Value and Performance", *Linear Technology*, vol. VI No. 1,(Feb. 1996),pp. 1,3–6, 22.

* cited by examiner

Primary Examiner—Timothy P. Callahan
Assistant Examiner—An T. Luu
(74) Attorney, Agent, or Firm—LeMoine Patent Services, PLLC

(57) ABSTRACT

A buffer circuit includes a resonant circuit. An output of the resonant buffer circuit transitions once for three transitions on an input.

20 Claims, 13 Drawing Sheets

RESONANT BUFFER APPARATUS, METHOD, AND SYSTEM

FIELD

The present invention relates generally to buffer circuits, and more specifically to low power buffer circuits.

BACKGROUND

A prior-art inverting buffer is shown in FIG. 1. Buffer 100 includes transistors 102 and 104. The buffer drives voltage $V_{OUT}$ on node 108 across load capacitor 110 to high and low values depending on voltage $V_{IN}$ on node 106. The capacitance value of capacitor 110 is shown as C. Voltage waveforms during the operation of buffer 100 are shown in FIG. 2. At time $t_1$ input voltage $V_{IN}$ goes high and output voltage $V_{OUT}$ goes low. At time $t_2$ $V_{IN}$ goes low and $V_{OUT}$ goes high. For two transitions of $V_{OUT}$ there are two transitions of $V_{IN}$.

If $E_{BUF}$ represents the energy dissipated in buffer 100 when C=0, then when C>0, the total dissipated energy for two transitions at $V_{OUT}$ is given by:

$$E_{TOT} = E_{BUF} + E_{LOAD}, \; E_{LOAD} = C^*(V_{CC} - V_{SS})^2 \quad (1)$$

Buffer energy $E_{BUF}$ has only a small dependence on the value of C. Even if a very small and very slow buffer was used, so that $E_{BUF}$ approaches zero, the total energy $E_{TOT}$ would always be larger than $E_{LOAD}$. The energy values can be normalized to load energy as follows:

$$\frac{E_{TOT}}{E_{LOAD}} = \frac{E_{BUF}}{E_{LOAD}} + 1 \geq 1 \quad (2)$$

Equation 2 shows that for a resistive buffer governed by equation 1, the normalized energy cannot decrease below one.

For the reasons stated above, and for other reasons stated below which will become apparent to those skilled in the art upon reading and understanding the present specification, there is a need in the art for alternate buffer circuits.

DESCRIPTION OF EMBODIMENTS

Figure 1:
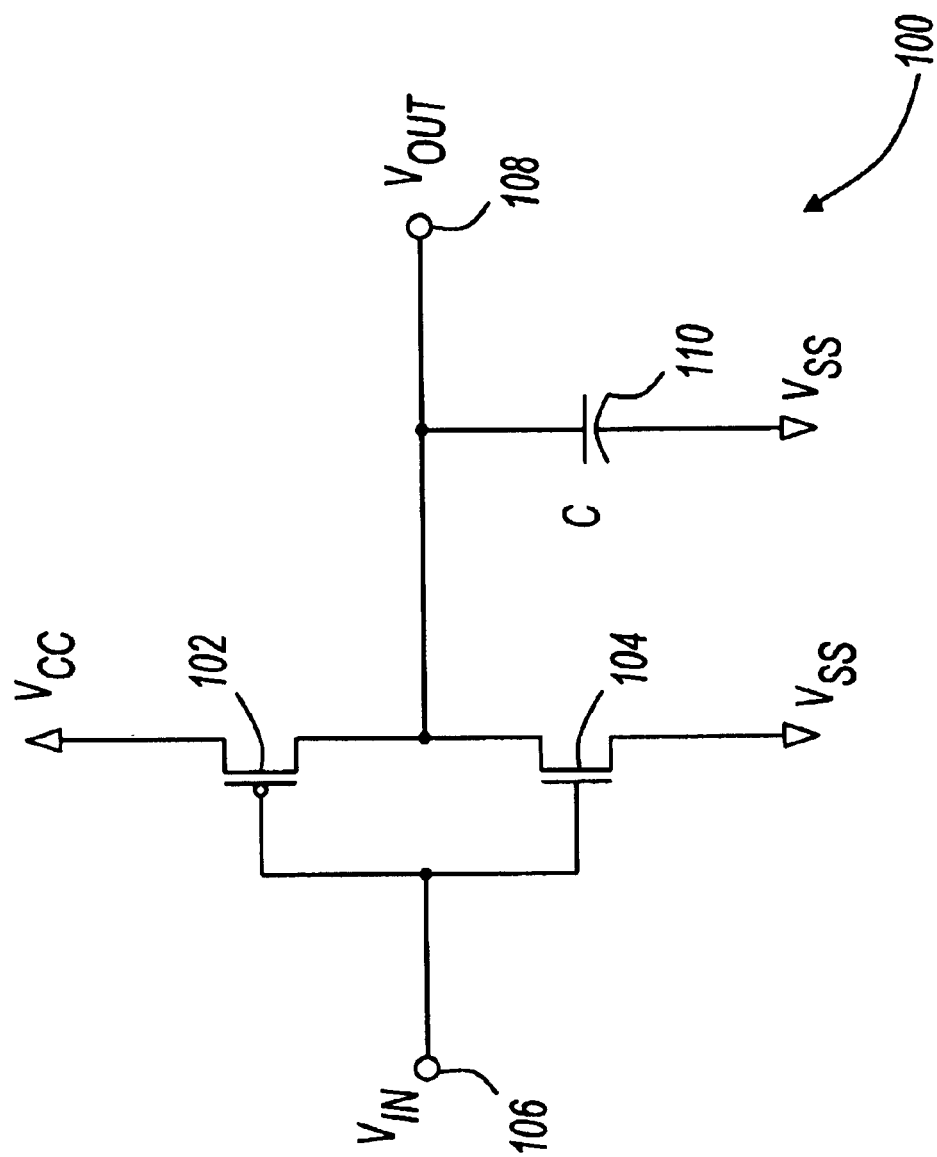
FIG. 1 shows a prior art buffer circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 3:
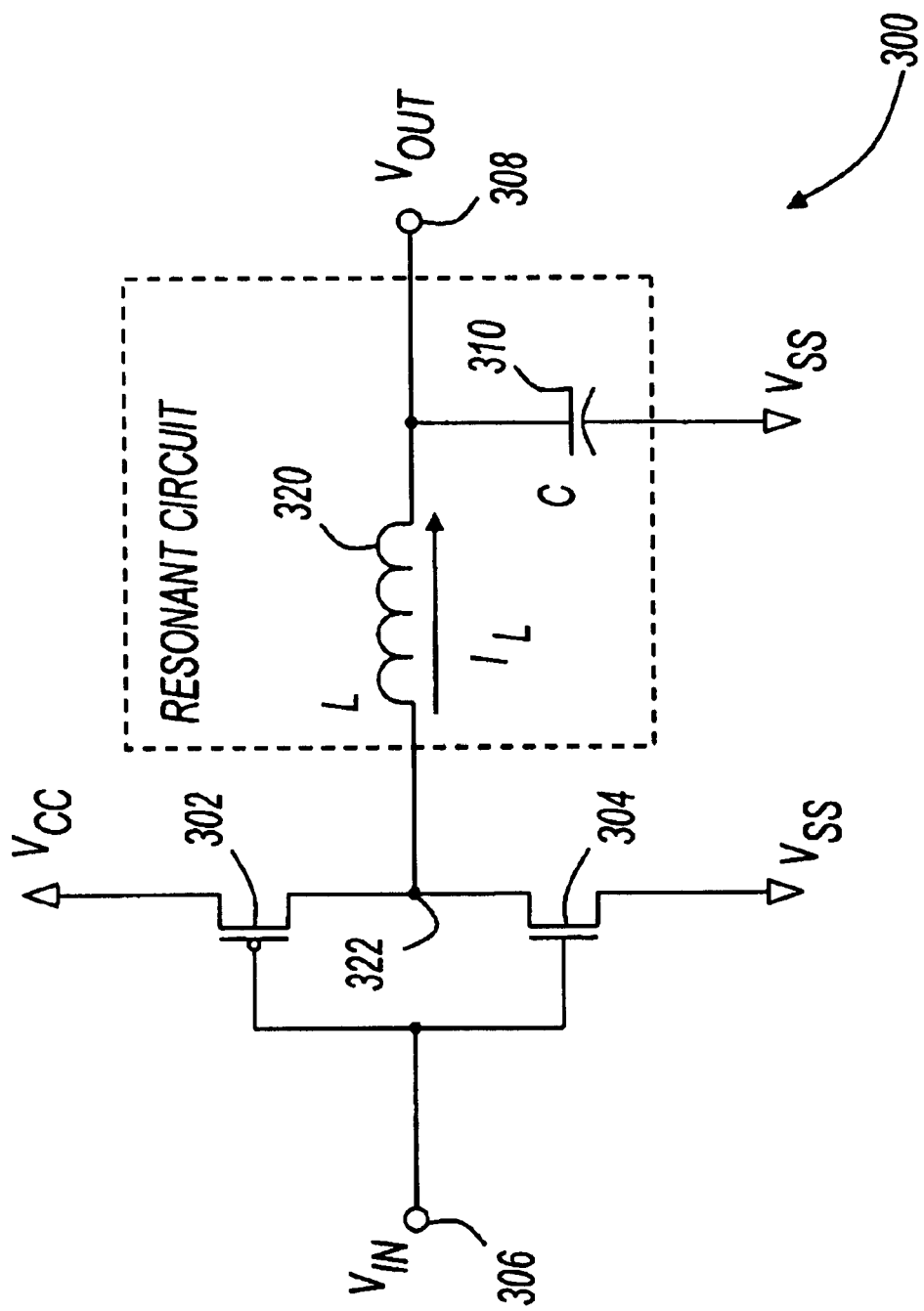
FIG. 3 shows a resonant buffer circuit.

FIG. 3 shows a resonant buffer circuit. Buffer 300 includes transistors 302 and 304 forming a logic inverter, and inductive element 320. Transistors 302 and 304 drive a voltage on node 322 in response to the voltage $V_{IN}$ on node 306. The voltage on node 322 and $V_{OUT}$ create a voltage across inductive element 320 and cause current $I_L$ to flow therethrough. As current flows through inductive element 320, capacitor 310 charges and discharges, thereby causing $V_{OUT}$ to change. Buffer 300 is operated differently from the prior-art buffer shown in FIG. 1. Similar output voltage waveforms $V_{OUT}$ are produced by buffers 100 and 300, but the input waveforms $V_{IN}$ are different.

Figure 4:
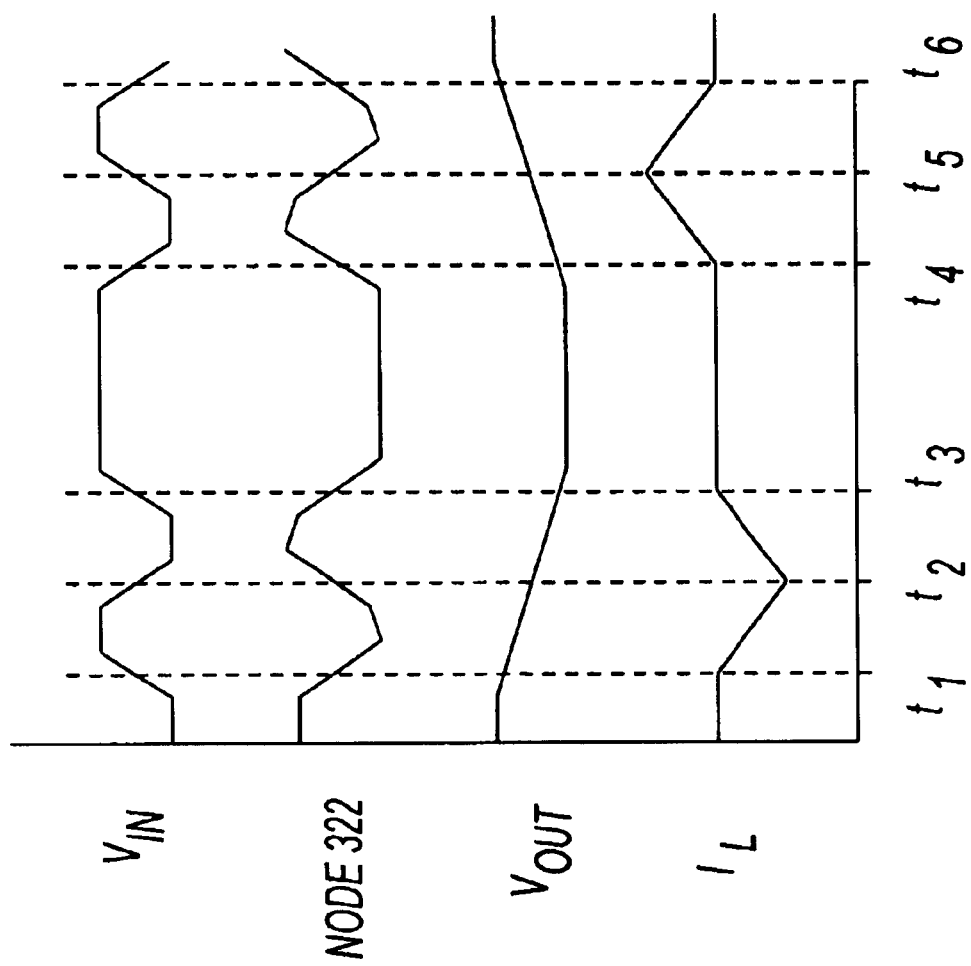
FIG. 4 shows voltage and current waveforms for the circuit of FIG. 3.

FIG. 4 shows voltage and current waveforms for the circuit of FIG. 3. As shown in FIG. 4, to realize one transition of $V_{OUT}$, input voltage $V_{IN}$ transitions three times. For example, $V_{IN}$ transitions high at time $t_1$. Node 322 transitions low and inductive element 320 experiences a negative voltage between node 322 and $V_{OUT}$. Current $I_L$ through inductive element 320 decreases to negative values. At time $t_2$, $V_{OUT}$ has accomplished approximately 50% of the transition. $V_{IN}$ transitions low, node 322 transitions high, and inductive element 320 experiences a positive voltage between node 322 and $V_{OUT}$. Current $I_L$ starts increasing until it approaches zero at time $t_3$. At time $t_3$, $V_{IN}$ transitions high, the voltage across inductive element 320 is substantially zero, and the transition of voltage $V_{OUT}$ completes. Between times $t_1$ and $t_3$, current $I_L$ is negative and $V_{OUT}$ is decreasing. Between times $t_1$ and $t_2$, inductive element 320 is storing energy, and between times $t_2$ and $t_3$, inductive element 320 is providing energy.

The operation of buffer circuit 300 between times $t_4$ and $t_6$ is similar to the operation between times $t_1$ and $t_3$. For example, $V_{IN}$ transitions low at time $t_4$. Node 322 transitions high and inductive element 320 experiences a positive voltage between node 322 and $V_{OUT}$. Current $I_L$ through inductive element 320 increases to positive values. At time $t_5$, $V_{OUT}$ has accomplished approximately 50% of the transition. $V_{IN}$ transitions high, node 322 transitions low, and inductive element 320 experiences a negative voltage between node 322 and $V_{OUT}$. Current $I_L$ starts decreasing until it approaches zero at time $t_6$. At time $t_6$, $V_{IN}$ transitions low, the voltage across inductive element 320 is substantially zero, and the transition of voltage $V_{OUT}$ completes. Between times $t_4$ and $t_6$ current $I_L$ was positive and $V_{OUT}$ was increasing. Between times $t_4$ and $t_5$, inductive element 320 is storing energy, and between times $t_5$ and $t_6$, inductive element 320 is providing energy.

In order to match the time when current $I_L$ reaches zero with the time when $V_{OUT}$ completes the transition, transition times $t_2$ and $t_3$ are selected relative to time $t_1$ depending on values of L and C. The solution for $t_2$ and $t_3$ when neglecting series resistance of the transistors, inductor, and capacitor is given by:

$$T = \frac{1}{2\pi\sqrt{LC}}, \; t_3 - t_2 = t_2 - t_1 = \frac{T}{6}, \; t_3 - t_1 = \frac{T}{3} \qquad (3)$$

Equation 3 shows that the frequency of the input $V_{IN}$ that determines the total transition time of the output $V_{OUT}$ is three times higher than the resonant frequency of the LC circuit. In other words, buffer 300 is a resonant buffer that operates at a third harmonic of the resonant frequency of the resonant circuit. Including the effects of series resistance in equation 3 results in slightly longer time $t_2$—$t_1$ and slightly shorter time $t_3$–$t_2$. For the rising transition of $V_{OUT}$, the waveforms are similar. For example, for equal resistance of pull up and pull down paths:

$$t_5 - t_4 = t_2 - t_1, \; t_6 - t_5 = t_3 - t_2 \qquad (4)$$

The dissipated energy attributed to the load is equal to the integral of $I_L$ during time portions when node 322 is high, multiplied by ($V_{CC}$–$V_{SS}$). FIG. 4 shows that from $t_2$ to $t_3$ current $I_L$ is negative and from $t_4$ to $t_5$, $I_L$ is positive. If the series resistance is assumed to be zero, node 322 would be at $V_{CC}$ and the dissipated energy would be zero. The energy that is taken from $V_{CC}$ between $t_4$ and $t_5$ would be substantially equal to energy that is supplied to $V_{CC}$ between $t_2$ and $t_3$. The assumption of zero series resistance is generally not valid because a finite series resistance will always exist in the various circuit elements. Assuming that portion "q" of load energy is recycled, then the total normalized energy can be written as:

$$E_{TOT} = 3 * E_{BUF} + (1 - q) * E_{LOAD}, \; E_{LOAD} = C * (V_{CC} - V_{SS})^2 \qquad (5)$$

$$\frac{E_{TOT}}{E_{LOAD}} = 3 * \frac{E_{BUF}}{E_{LOAD}} + (1 - q) \geq (1 - q) \qquad (6)$$

By increasing the size of inductive element 320 and allowing longer transition time, resonant buffer 300 can achieve q close to 1. By reducing the size of transistors 302 and 304 in buffer 300, $E_{BUF}$ can be reduced and resonant buffer 300 can achieve normalized energy close to zero.

Transistors 302 and 304 are shown in FIG. 3 as isolated gate transistors, and specifically as metal oxide semiconductor field effect transistors (MOSFETs). Transistor 302 is shown as a P-type MOSFET, and transistor 304 is shown as an N-type MOSFET. Other types of switching devices may be utilized for transistors 302 and 304 without departing from the scope of the present invention. For example, transistors 302 and 304 may be junction field effect transistors (JFETs), bipolar junction transistors (BJTs), or any device capable of switching current as described above.

Inductive element 320 can be any type of device capable of storing energy in an inductive fashion. For example, inductive element 320 can be a single winding, a transformer, or a signal trace with inductive properties. Traces on integrated circuit die, integrated circuit packages, and circuit boards can also serve as inductive element 320.

Capacitor 310 represents any capacitance that can influence the resonant frequency of the circuit. A circuit element dedicated to function as capacitor 310 is not necessary. For example, capacitor 310 may be provided solely by a capacitive load presented by devices driven by buffer 300. Parasitic capacitances resulting from traces and stray coupling may also be part of capacitor 310.

Figure 5:
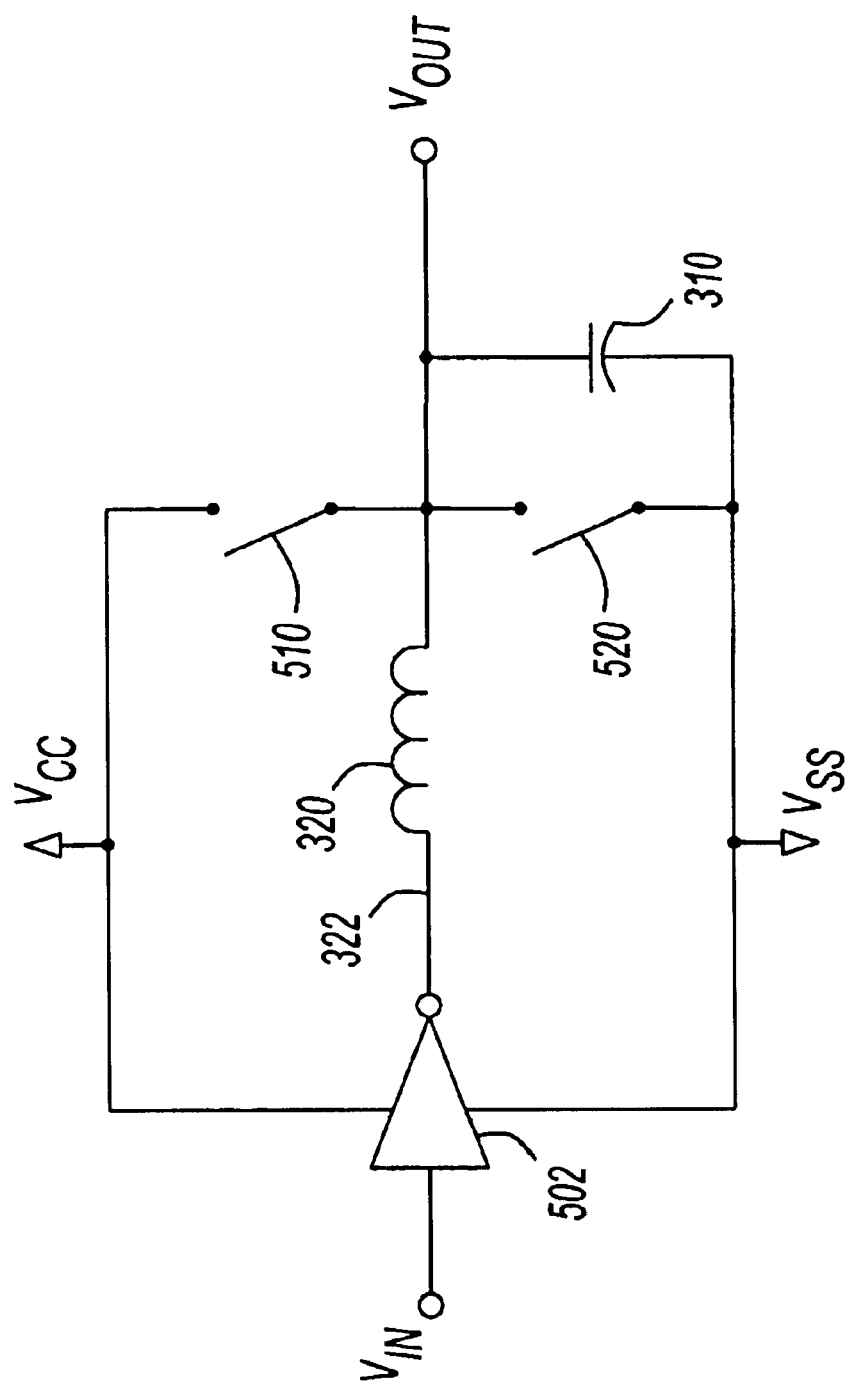
FIGS. 5 and 6 show multiple resonant buffer circuits.
Figure 6:
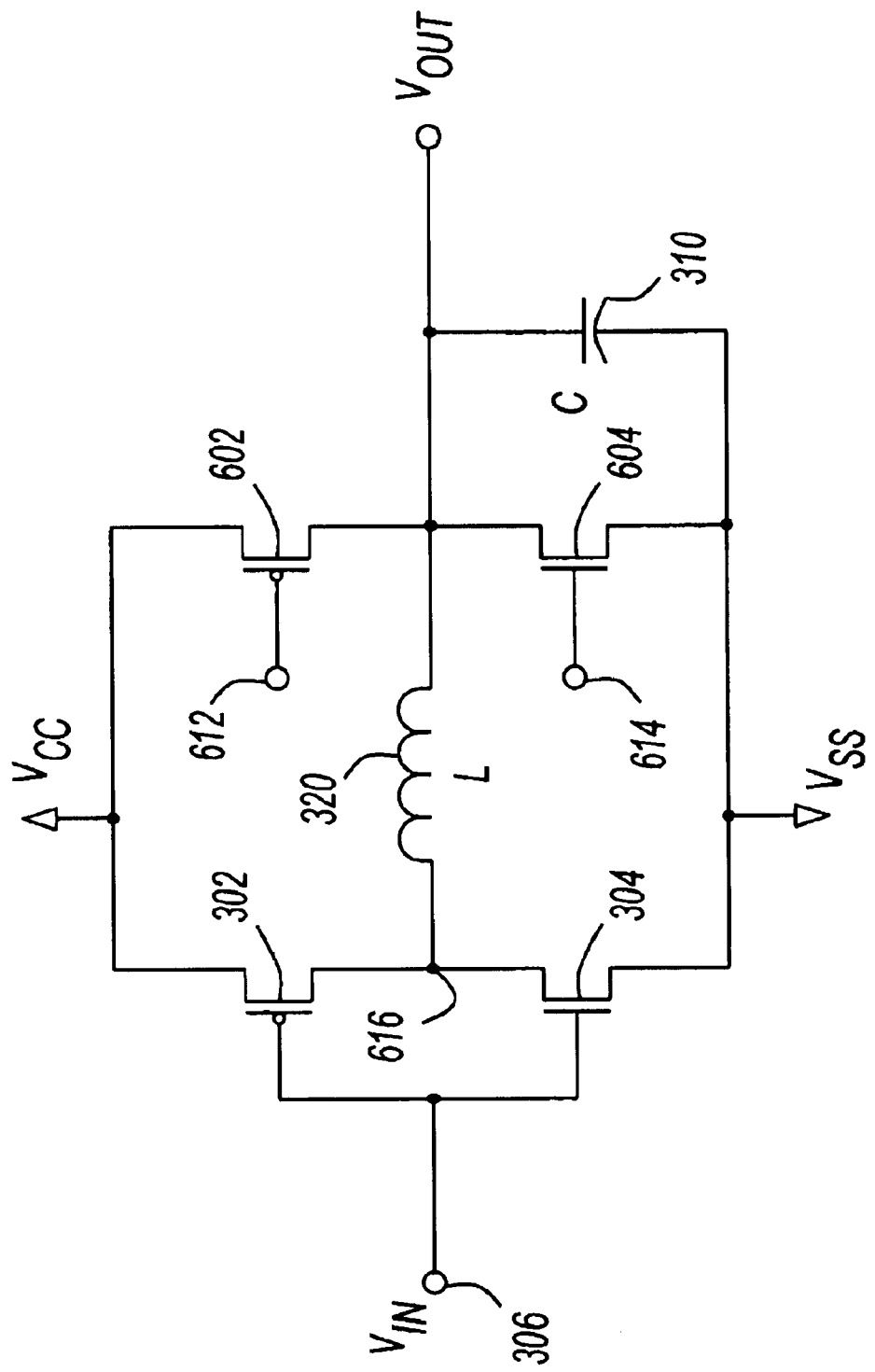

FIGS. 5 and 6 show multiple resonant buffer circuits. The resonant buffer circuits of FIGS. 5 and 6 include clamp circuits configured to clamp the voltage $V_{OUT}$ at either $V_{CC}$ or $V_{SS}$. FIG. 5 includes buffer 502, inductive element 320, capacitor 310, and switches 510 and 520 configured to operate as clamp circuits.

Referring now back to FIGS. 3 and 4, current $I_L$ may not reach exactly zero at times $t_3$ and $t_6$, and $V_{OUT}$ may settle to a voltage other than the desired value. Over time, voltage errors may accumulate, and $V_{OUT}$ may drift away from the desired range. Switches 510 and 520 of FIG. 5 prevent voltage errors from accumulating by clamping $V_{OUT}$ to either $V_{CC}$ or $V_{SS}$ at the appropriate time. For example, at time $t_3$, switch 520 may be closed, thereby clamping $V_{OUT}$ at $V_{SS}$. Also for example, at time $t_6$, switch 510 may be closed, thereby clamping $V_{OUT}$ at $V_{CC}$. Since any residual current at times $t_3$ and $t_6$ should be much smaller than the peak current of $I_L$, switches 510 and 520 can be more resistive (e.g., smaller and weaker) than switches used within buffer 502 for driving node 322, but this is not necessary.

Figure 7:
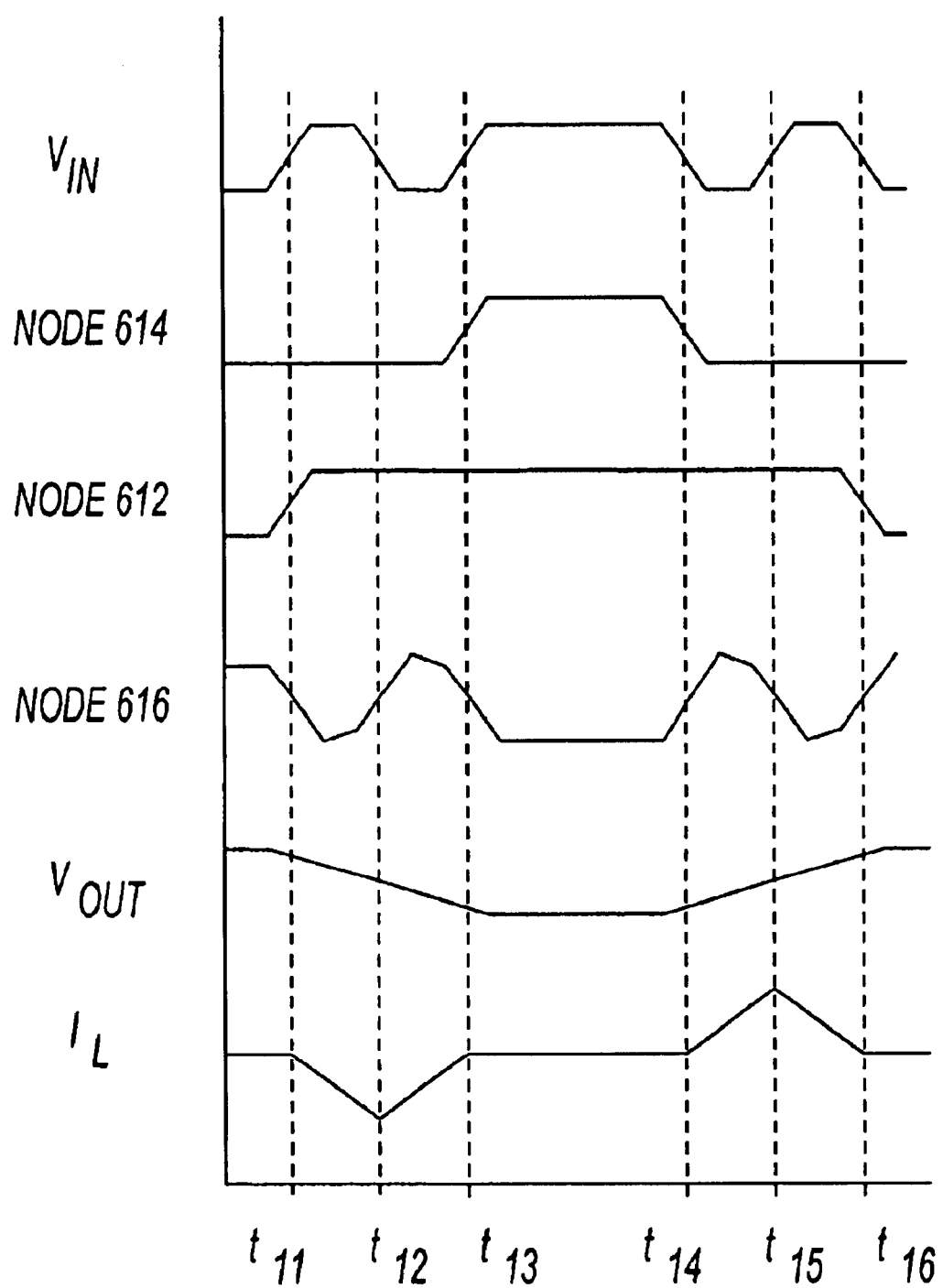
FIG. 7 shows voltage and current waveforms for the circuit of FIG. 6.

FIG. 6 shows a resonant buffer circuit with clamp circuits made with transistors. Transistor 602 corresponds to switch 510 (FIG. 5); and transistor 604 corresponds to switch 520 (FIG. 5). FIG. 7 shows voltage and current waveforms for the circuit of FIG. 6. FIG. 7 differs from FIG. 4 by the addition of control signals for nodes 612 and 614. The control signal on node 612 causes $V_{OUT}$ to be clamped at $V_{CC}$, and the control signal on node 614 causes $V_{OUT}$ to be clamped at $V_{SS}$.

Figure 2:
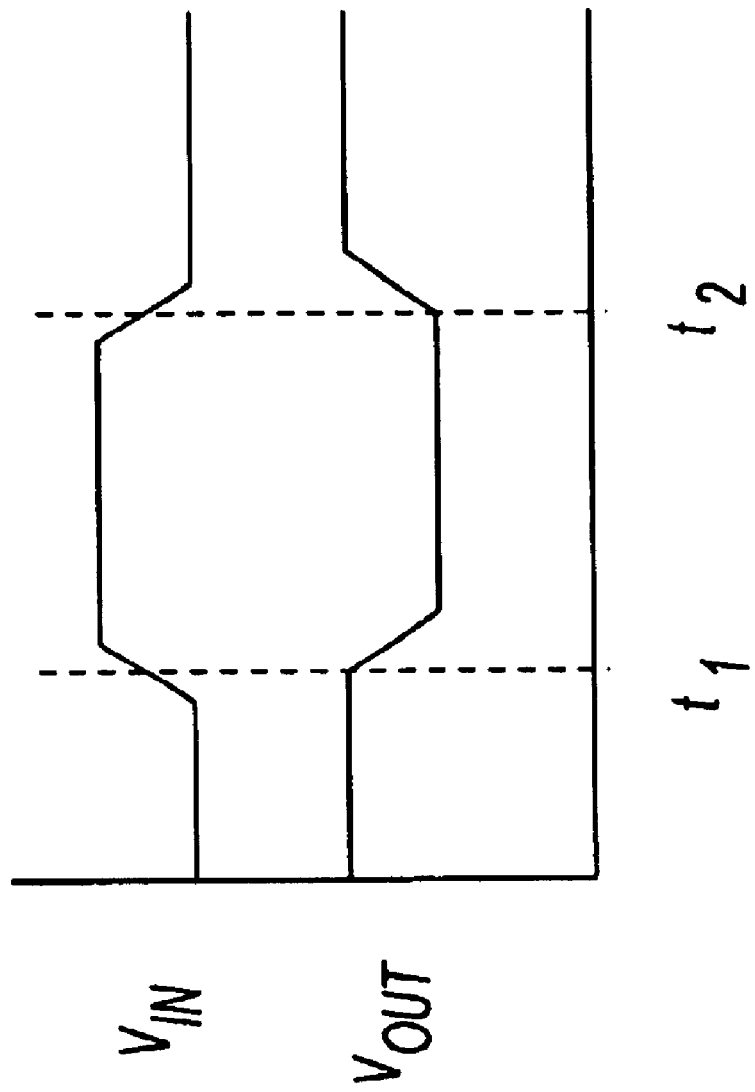
FIG. 2 shows voltage waveforms for the circuit of FIG. 1.
Figure 8:
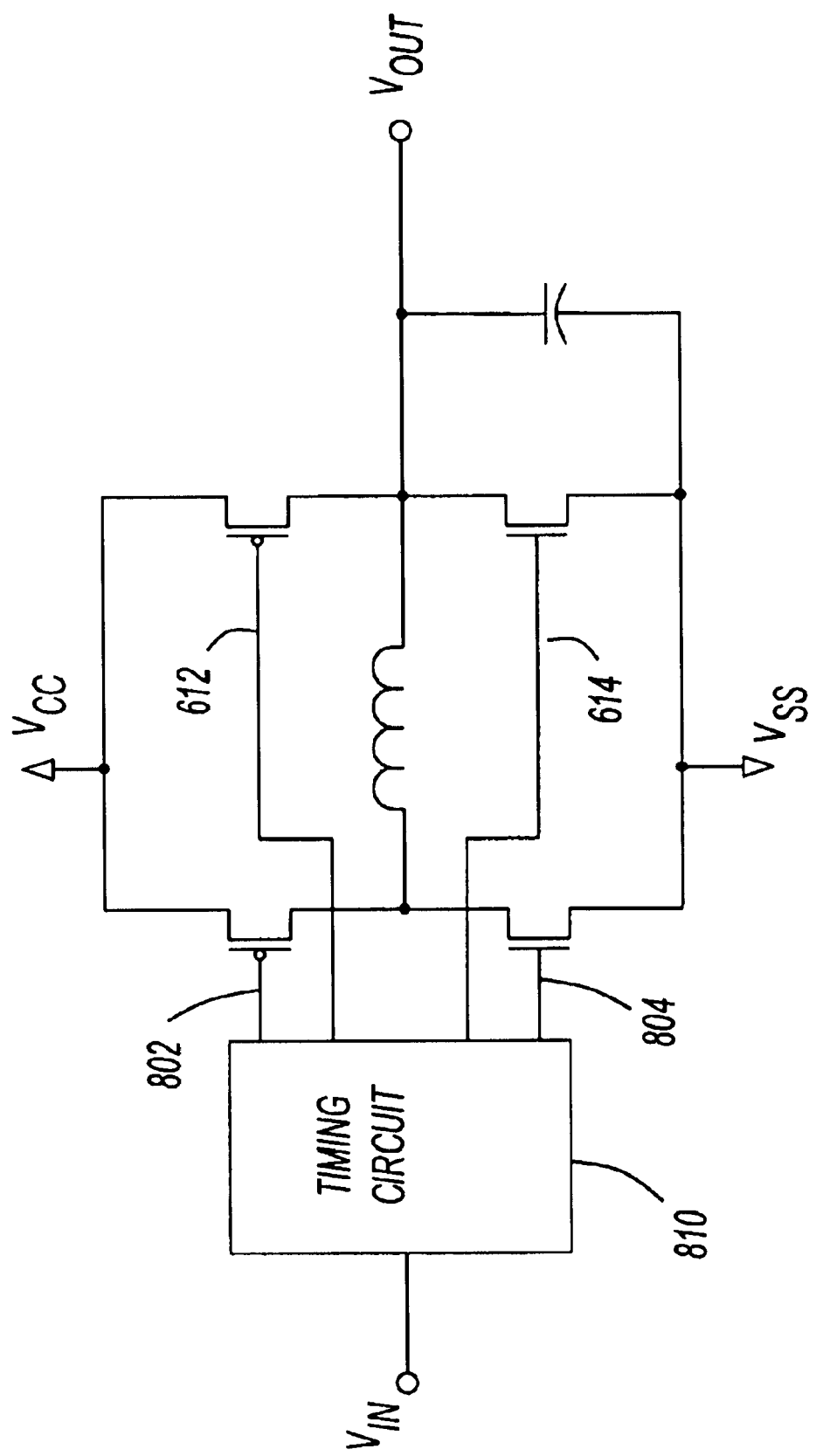
FIG. 8 shows a resonant buffer circuit with a timing circuit.

FIG. 8 shows a resonant buffer circuit with a timing circuit. In embodiments represented by FIG. 8, timing circuit 810 receives $V_{IN}$ and generates control signals on nodes 802, 804, 612, and 614. Timing circuit 810 can be implemented such that $V_{IN}$ and $V_{OUT}$ waveforms are substantially identical to those in FIG. 2 and the resonant buffer of FIG. 8 can directly replace the prior art buffer of FIG. 1.

When timing circuit 810 detects a single transition of $V_{IN}$, the timing circuit causes three transitions on each of nodes 802 and 804, and then can optionally clamp $V_{OUT}$ to either $V_{CC}$ or $V_{SS}$ by asserting a signal on node 612 or 614.

The various embodiments described above enable low-power buffering of a capacitive load for various output transition times. Resonant buffers can be used in many different applications, including high-speed high-efficiency switching DC-DC power converters. For example, some embodiments of the resonant buffer are used for power delivery to a microprocessor die, when the power is transported at high voltage and small current and converted into a smaller microprocessor operating voltage and large current. The converter can be embedded on the microprocessor die or on another die physically close to the microprocessor. One or several output voltages can be generated from a single input voltage. The reduction of the input current reduces the cost of power delivery on the package, socket, and circuit board. These power delivery embodiments are described below with reference to FIGS. 10–13.

Figure 9:
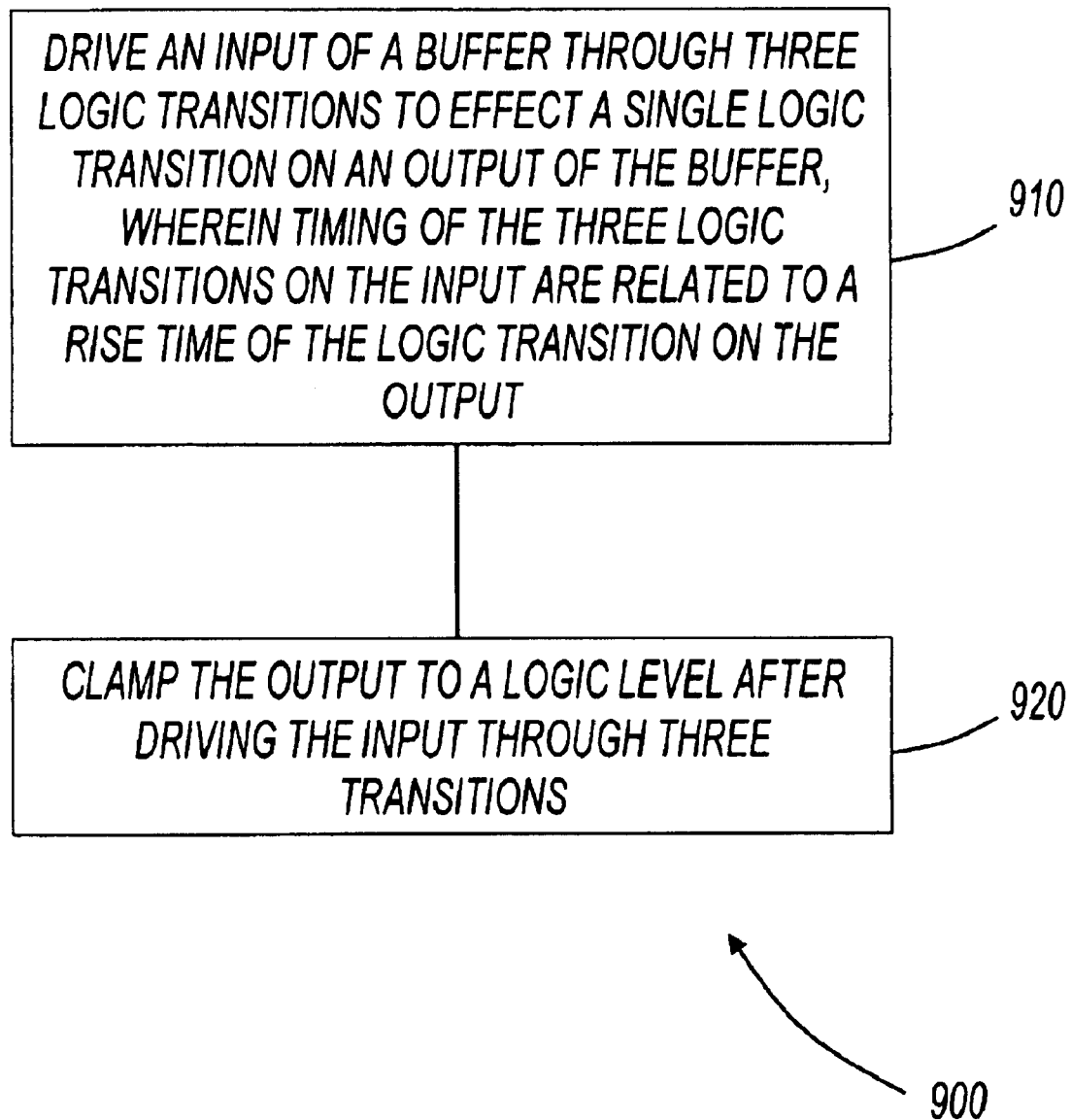
FIG. 9 shows a flowchart in accordance with various embodiments of the present invention.

FIG. 9 shows a flowchart in accordance with various embodiments of the present invention. In some embodiments, method 900, or portions thereof, is performed by a resonant buffer, embodiments of which are shown in previous figures. In other embodiments, method 900 is performed by an integrated circuit or an electronic system. Method 900 is not limited by the particular type of apparatus performing the method. The various actions in method 900 may be performed in the order presented, or may be performed in a different order. Further, in some embodiments, some actions listed in FIG. 9 are omitted from method 900.

Method 900 is shown beginning with block 910 in which the input of a buffer is driven through three logic transitions to effect a single logic transition on an output. The timing of the three transitions on the input are related to the rise time of the logic transition on the output For example, referring now back to FIGS. 4 and 7, for each transition of $V_{OUT}$, $V_{IN}$ transitions three times. The timing of the transitions on the input are related to the rise time of the output. For example, in some embodiments, the timing of the three logic transitions on the input are related to a harmonic frequency of a resonant circuit associated with the buffer. In this context, "rise time" refers to the time it takes for $V_{OUT}$ to rise or fall through a logic transition.

In block 920, the output is clamped to a logic level after driving the input through three transitions. In some embodiments, this is performed with a switch on the output of the buffer as shown in FIGS. 5, 6, and 8. In some embodiments of method 900, the output is clamped to a high logic level, and in other embodiments, the output is clamped to a low logic level.

Figure 10:
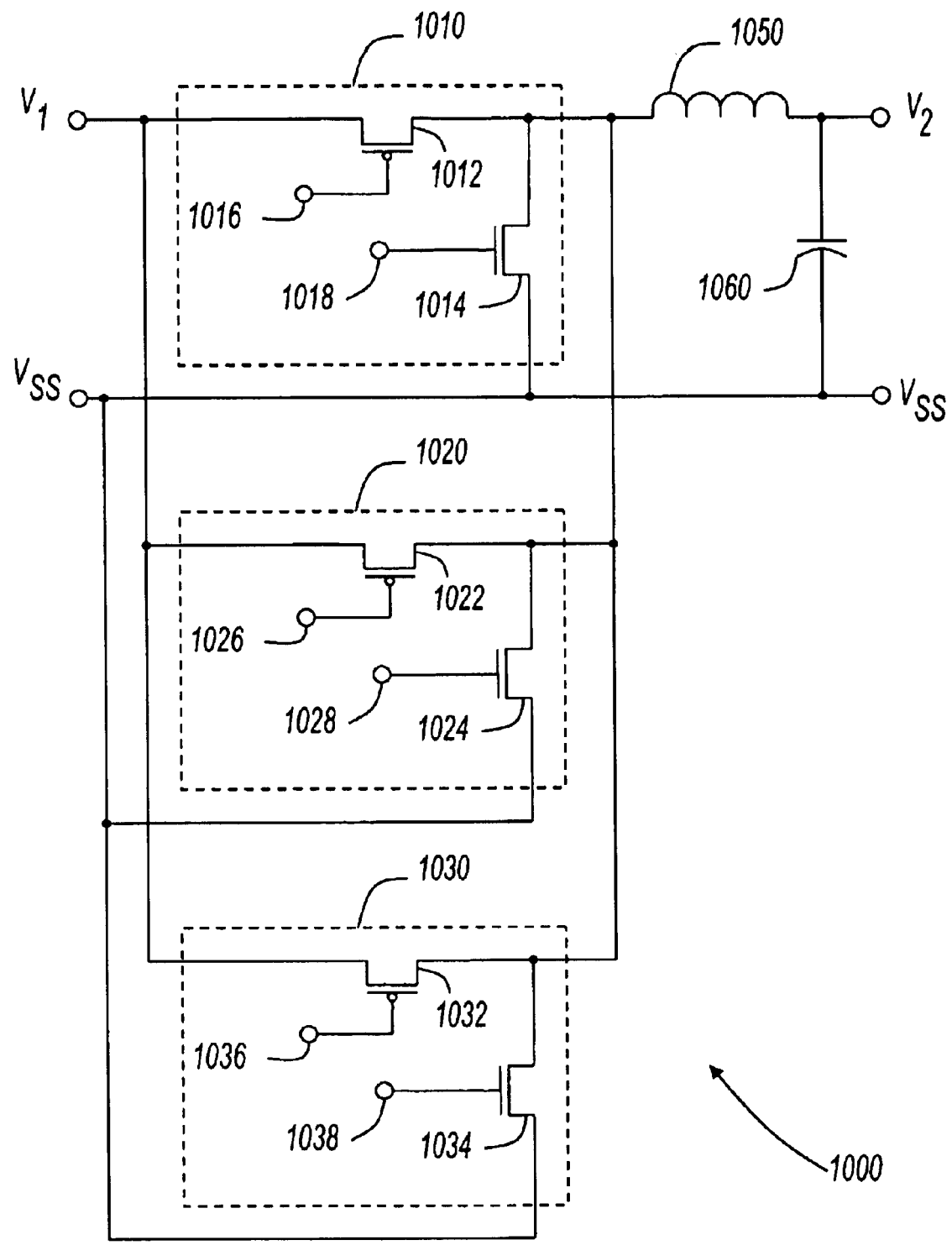
FIG. 10 shows bridge circuits for use in a power converter.

FIG. 10 shows bridge circuits for use in a power converter. Circuits 1000 represent example circuits suitable for a type of power converter referred to herein as "switched-inductor converters (S-LCs)." Switched-inductor converters are useful for converting an input DC voltage $V_1$ into an output DC voltage $V_2$. In embodiments represented by FIG. 10, $V_2$ has the same polarity as $V_1$. In other embodiments, $V_2$ has a different polarity than $V_1$, and in still other embodiments, output terminals providing voltage $V_2$ may be electrically isolated from the input terminals coupled to voltage $V_1$. Further, $V_2$ can have a larger or smaller magnitude than $V_1$.

Circuits 1000 include "bridge" circuits 1010, 1020, and 1030 coupled to inductive element 1050. Inductive element 1050 may be a simple two-terminal inductor without a magnetic core, a simple two-terminal inductor with a magnetic core, a transformer without a magnetic core, a transformer with a magnetic core, or any other suitable inductive element. A transformer is a device consisting of at least two inductors that exhibit magnetic field coupling. A magnetic core is a core with a magnetic permeability larger than the permeability of a vacuum.

Switching of inductive element 1050 is accomplished via bridges 1010, 1020, and 1030. One or more of bridges 1010, 1020, and 1030 periodically reverse the polarity of the voltage across the inductive element 1050 in order to prevent magnetic saturation of the core, and to enable regulation of the power delivered to the output. Each of bridges 1010, 1020, and 1030 includes two transistors; one to couple $V_1$ to inductive element 1050, and one to couple $V_{SS}$ to inductive element 1050.

The topology represented by FIG. 10 is referred to as a "buck" topology. Other embodiments utilize other switching devices and bridge topologies. For example, in some embodiments, bridges 1010, 1020, and 1030 include other switching devices, such as PN diodes, Schottky diodes, MOSFET transistors, bipolar transistors, and other types of transistors. Also for example, in some embodiments, bridges 1010, 1020, and 1030 employ other S-LC topologies, such as boost, fly-back, forward, or others. Each of these different topologies utilizes a bridge to switch the terminals of an inductor or a transformer similar to FIG. 10.

Bridge 1010 is shown having transistors 1012 and 1014 with control terminals 1016 and 1018, respectively. Bridge 1020 is shown having transistors 1022 and 1024 with control terminals 1026 and 1028, respectively. Bridge 1030 is shown having transistors 1032 and 1034 with control terminals 1036 and 1038, respectively. A DC-DC converter can be formed by applying appropriate signals to the control terminals of the various bridge circuits.

Conversion of power is not 100% efficient. Much of the power losses are dissipated in the power section of the S-LC, either on the inductive elements, or on the bridges. There are capacitive losses on the bridge due to charging and discharging of the control terminal of a switching device (e.g., a transistor) of the bridge, and resistive losses caused by a non-zero resistance of a switching device (e.g., a diode or transistor) while delivering current to an inductive element. Similarly, there are capacitive and resistive losses associated with inductive elements.

In some embodiments, the transistors included within bridges 1010, 1020, and 1030 are relatively large switching transistors capable of carrying the current (or portions thereof) that flows through inductive element 1050. These relatively large transistors can have a correspondingly large input capacitance. In other words, the control terminals present a relatively large capacitive load to the circuits that drive them. As described in the previous paragraph, the power consumed in driving the input capacitance of the switching transistors degrades power conversion efficiency. As described with reference to FIG. 12 below, a resonant buffer can be combined with the circuits of FIG. 10 to reduce switching losses and increase conversion efficiency.

Conversion efficiency can be dependent on the output load. At small load current, small power is being delivered to the output. However, capacitive bridge losses do not tend to decrease when the load current is reduced. Therefore, efficiency decreases at small load currents. At large load current, output power increases proportionally to the load current. However, resistive losses increase with the square of the load current. Therefore, efficiency reduces at large load currents. In order to reduce heat generation, it can be desirable to achieve high-efficiency at large load currents. Accordingly, the operating point is often chosen to be located close to the specified maximum load current. However, this can lead to poor efficiency at small load currents.

Various embodiments of the present invention increase the efficiency at various load currents by removing one or more bridges from the circuit. For example, referring again to FIG. 10, during large load currents, all three bridge circuits can be operated to provide the large current. During periods of small load currents, one or more of the bridges can be turned off, or "de-activated," to reduce power consumption due to switching. For example, bridge 1030 can be turned off by holding control terminals 1036 and 1038 at static voltage values that cause transistors 1032 and 1034 to be non-conducting. Because the control signals are static, the capacitive load due to transistors 1032 and 1034 need not be charged, and switching power is reduced.

In some embodiments, the transistors in each of the bridge circuits are sized substantially equally so that each can provide substantially the same amount of current. As the load current requirement increases, bridges can be turned on, or "activated," in a linear fashion. In other embodiments, the transistors in each of the bridge circuits are sized differently so that different bridges have different current capabilities. For example, in some embodiments, transistors 1012 and 1014 are sized to have roughly twice the current capability as the other switching transistors shown in FIG. 10. In these embodiments, bridge 1010 is rated to carry 50% of the maximum current, and each of bridges 1020 and 1030 are rated to carry 25% of the maximum current for a total of 100%. As the required load current varies, different bridges can be turned on or off ("activated" or "de-activated").

FIG. 10 shows three bridge circuits. In some embodiments, many more than three bridge circuits are included. Further, the various bridge circuits can have any size relationship.

Figure 11:
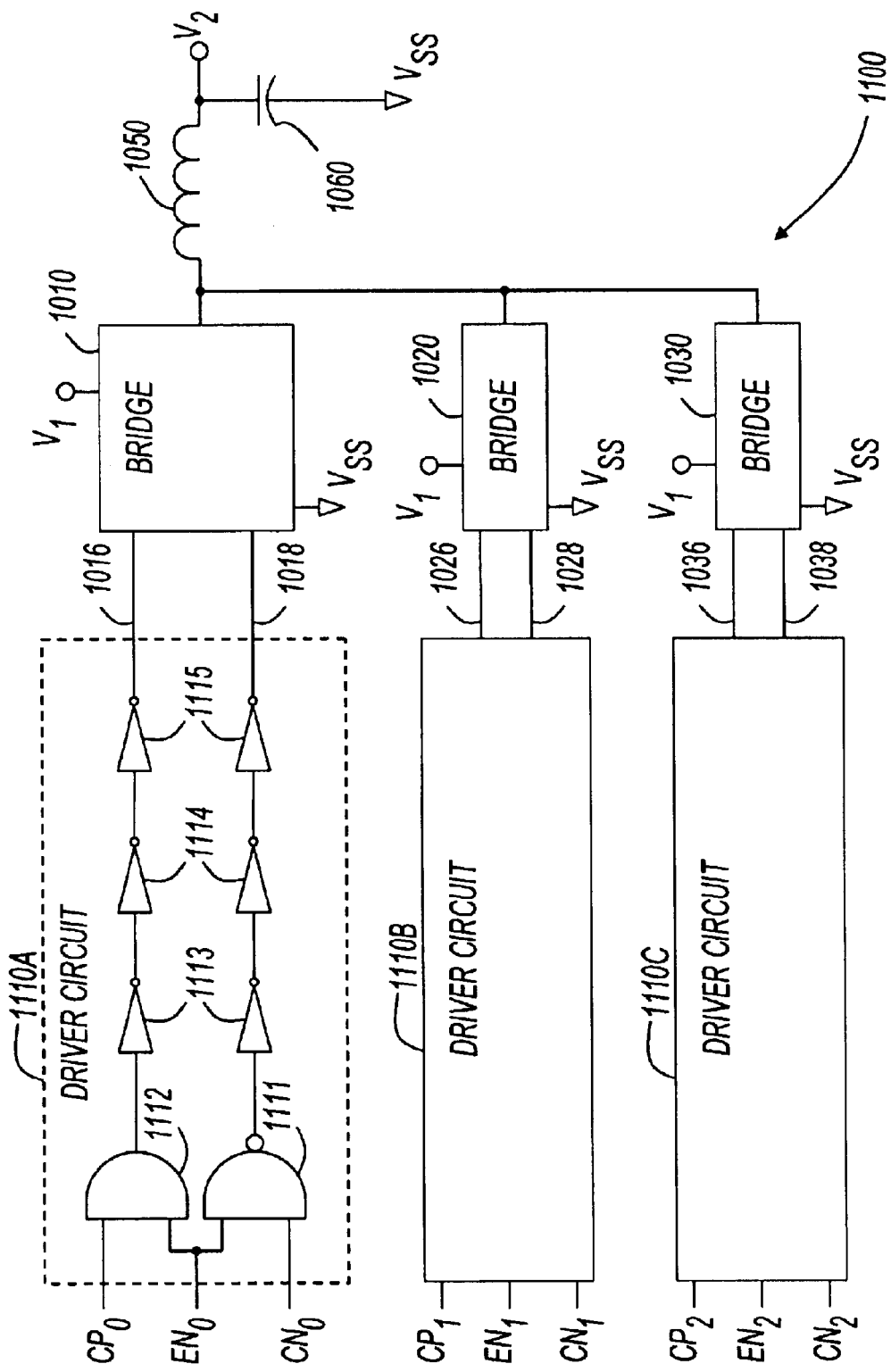
FIG. 11 shows a portion of a power converter with resonant buffers.

FIG. 11 shows a portion of a power converter with resonant buffers. Circuit 1100 includes bridge circuits 1010, 1020, and 1030, driver circuits 1110A, 1110B, and 1110C, inductive element 1050, and capacitive load 1060. Bridge circuits 1010, 1020, and 1030, and inductive element 1050 are described above with reference to FIG. 10.

Driver circuits 1110A, 1110B, and 1110C each drive the control nodes corresponding to one of bridges 1010, 1020, and 1030. As described with reference to FIG. 10 above, these control nodes can present different amounts of capacitive load based on the current carrying capacity of a particular bridge. When the control nodes for a particular bridge are held static, the switching losses associated with that bridge can be brought to near zero. Details for driver circuit 1110A are shown. Driver circuits 1110B and 1110C are similar to driver circuit 1110A.

Driver circuit 1110A includes "AND" gate 1112, "NAND" gate 1111, and inverting buffers 1113, 1114, and 1115. AND gate 1112 receives the enable signal "$EN_0$" and the control signal "$CP_0$" and NAND gate 111 receives $EN_0$ and the control signal "$CN_0$". When $EN_0$ is asserted low, the output signal on node 1016 is high, and the output signal on node 1018 is low, thereby de-activating bridge 1010. When a bridge is de-activated, the switching losses associated with the bridge and the driver circuit are near zero.

When a bridge is activated, the capacitive load presented by bridge inputs are charged and discharged. For example, when bridge 1010 is activated, driver circuit 1110A charges the capacitive loads presented by nodes 1016 and 1018. In some embodiments, buffers 1115 are resonant buffers such as those shown in FIGS. 3, 5, 6, and 8. In these embodiments, the capacitive load presented by the bridge inputs serves as the capacitance in the resonant circuit. For example, referring to FIG. 3, when resonant buffer 300 is used for buffers 1115 in FIG. 11, capacitance 310 is provided by the capacitance on nodes 1016 and 1018.

In some embodiments, $CP_0$ and $CN_0$ operate at the third harmonic of the resonant frequency of the resonant buffers 1115. For example, a control circuit can generate three transitions on $CP_0$ and $CN_0$ for each desired transition on nodes 1016 and 1018. In other embodiments, for example when the resonant buffer of FIG. 8 is used for buffer 1115, $CP_0$ and $CN_0$ only transition once for each desired transition on nodes 1016 and 1018.

In some embodiments, buffers 1113, 1114, and 1115 are sized to be progressively larger left-to-right to reduce the overall switching losses. In other embodiments, buffers 1113, 1114, and 1115 are sized substantially the same. Any number of buffers can be utilized without departing from the scope of the invention. In addition, buffers 1115 within each of driver circuits 1110A, 1110B, and 1110C can be sized proportional to the size of the switching transistor that they are driving.

At large load currents, all bridges are activated. At small load currents, only some bridges are activated. At large load currents, resistive losses of the bridges are important. Activating all bridges reduces the effective resistance of the bridge switching transistors connected in series with the inductive element. At small load currents, resistance of the bridge is less important, and the capacitive losses dominate. In order to reduce the capacitive losses, some bridges are de-activated, so that the buffers and the transistors associated with those bridges no longer contribute to the capacitive losses.

In the circuit of FIG. 11, the total inductance coupled to the output is substantially constant. Since the output inductance is directly related to the output impedance of the S-LC, the transient response of the S-LC is substantially the same as the case when all bridges are activated. If the resistance of the bridges is kept to a small fraction of the output impedance, e.g. 5%, efficiency can be increased. If 75% of the current carrying capacity of the bridges is deactivated, this increases the output impedance of the S-LC only by less than 15%, and the transient response is not significantly degraded.

The enable signals $EN_0$, $EN_1$, and $EN_2$ may be controlled by a control circuit in response to load conditions. For example, a control circuit (not shown) can detect the current requirements of the load, and activate or de-activate bridges based on total load current requirements. The control circuit may also modulate a pulse width of control signals $CP_0$, $CN_0$, $CP_1$, $CN_1$, $CP_2$, and $CN_2$.

Figure 12:
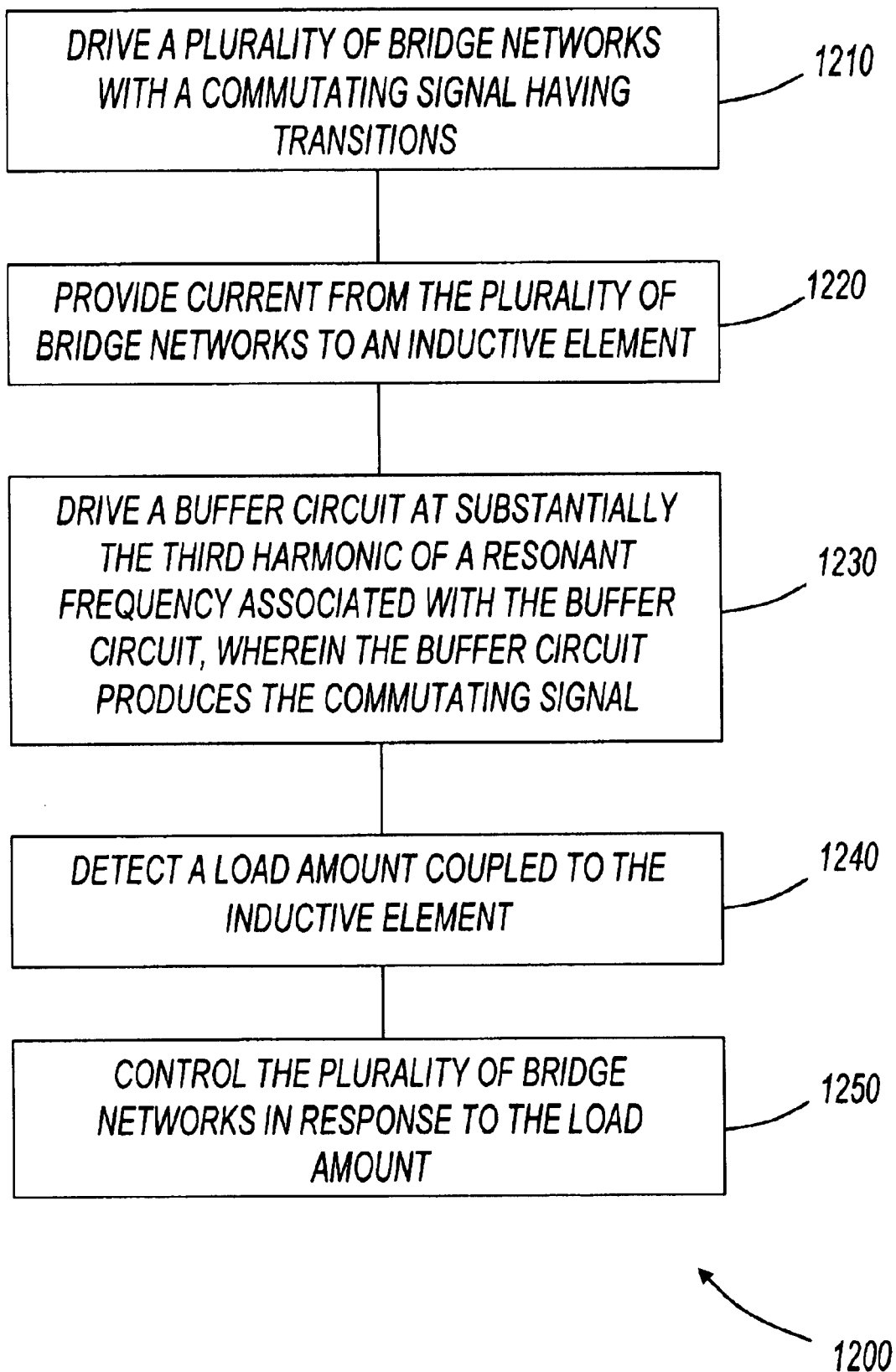
FIG. 12 shows a flowchart in accordance with various embodiments of the present invention.

FIG. 12 shows a flowchart in accordance with various embodiments of the present invention. In some embodiments, method 1200, or portions thereof, is performed by a power converter employing resonant buffers, embodiments of which are shown in previous figures. In other embodiments, method 1200 is performed by an integrated circuit or an electronic system. Method 1200 is not limited by the particular type of apparatus performing the method. The various actions in method 1200 may be performed in the order presented, or may be performed in a different order. Further, in some embodiments, some actions listed in FIG. 12 are omitted from method 1200.

Method 1200 is shown beginning with block 1210 in which a plurality of bridge networks is driven with a commutating signal. In block 1220, current is provided to an inductive element from the plurality of bridge networks. In block 1230, a buffer circuit that produces the commutating signal is driven at substantially the third harmonic of a resonant frequency associated with the buffer circuit.

Referring now back to FIG. 11, the bridge networks of method 1200 correspond to bridges 1010, 1020, and 1030, and the inductive element corresponds to inductive element 1050. The commutating signal corresponds to signals on nodes 1016, 1018, 1026, 1028, 1036, and 1038, and the buffer circuit corresponds to buffers 1115.

The resonant frequency associated with the buffer circuit corresponds to the resonant frequency discussed above with reference to the various embodiments of resonant buffers. In general, the resonant frequency is influenced by an inductance value as well as resistance and capacitive loading of the buffer circuit. By driving the buffer circuit at the third harmonic, the input signal to the buffer circuit transitions three times for each transition of the commutating signal.

In block 1040, an amount of a load current supplied by output $V_2$ is detected. Load current sensing can be performed in many ways. Any load current sensing apparatus useful for switching power converters can be utilized to detect the load current at output $V_2$. In block 1050, the plurality of bridge networks are controlled in response to the detected load current amount. The control of the bridge networks can be in the form of pulse width modulation of the commutating signal or in the form of activation and de-activation of one or more bridge networks.

Figure 13:
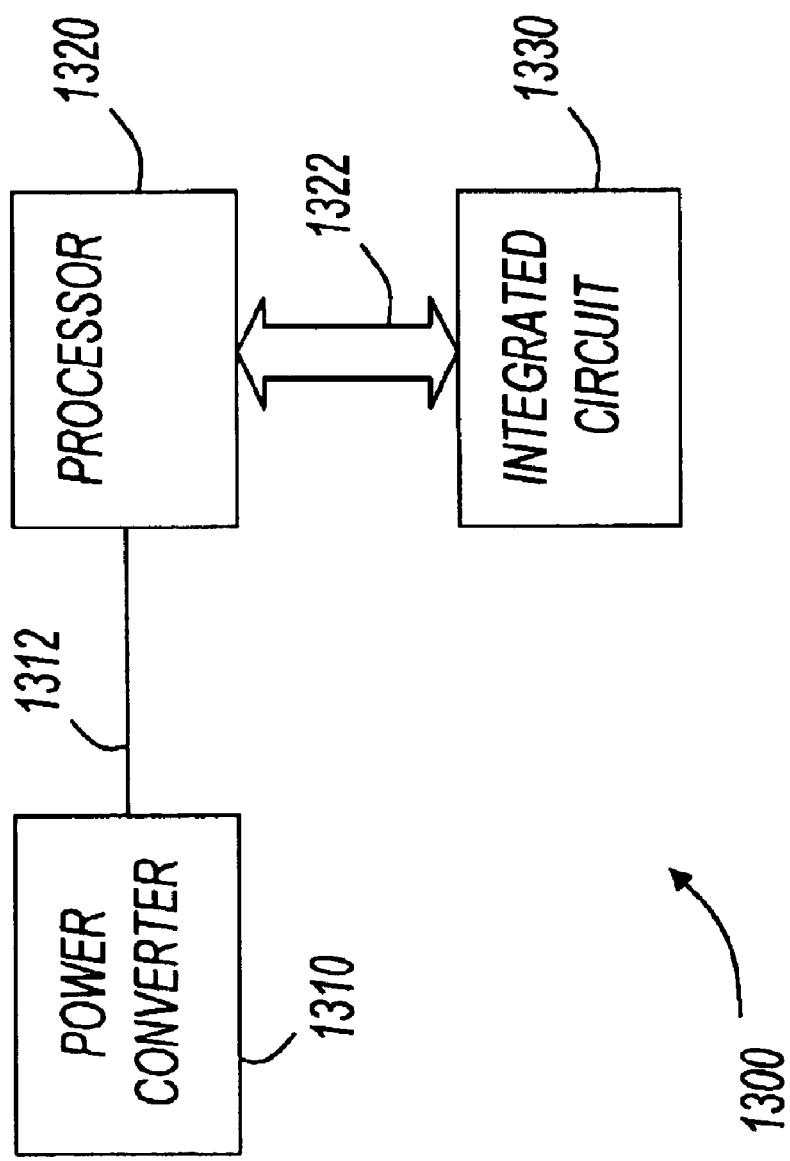
FIG. 13 shows a system diagram in accordance with various embodiments of the present invention.

FIG. 13 shows a system diagram in accordance with various embodiments of the present invention. System 1300 includes power converter 1310, and processor 1320 and integrated circuit 1330 coupled by conductor 1312 and bus 1322. Processor 1320 and integrated circuit 1330 can be any type of integrated circuit. For example, either or both of processor 1320 and integrated circuit 1330 can be a processor such as a microprocessor, a digital signal processor, a microcontroller, or the like. Processor 1320 or integrated circuit 1330 can also be an integrated circuit other than a processor such as an application-specific integrated circuit (ASIC), a communications device, a modem, a testing device, a network router, a memory controller, or a memory such as a dynamic random access memory (DRAM).

Power converter 1310 provides power to processor 1320. Power converter 1310 corresponds to any of the previously described power converter embodiments that utilize a resonant buffer. In some embodiments, power converter 1310 is included on the same integrated circuit die as processor 1320. In other embodiments, power converter 1310 is on a separate integrated circuit die, but in the same package as processor 1320. For example, in some embodiments, processor 1320 includes a microprocessor, and power converter 1310 and processor 1320 are included in the same integrated circuit package. In still other embodiments, both power converter 1310 and processor 1320 are packaged together with the exception of the inductive element at the output of the power converter and/or inductive elements utilized in resonant buffers. In some of these embodiments, the inductive element is a discrete device that is not included on either integrated circuit die.

In some embodiments, power converter 1310 is embedded on die of other circuits and generates one or more supply voltages to power a microprocessor core, cache, I/O buffers, and other circuitry. These embedded power converters can be powered from input voltages several times higher, e.g. two or three times higher, than the output voltage supplied to the microprocessor cores. Consequently, higher voltage, and proportionately lower current can be supplied to the microprocessor die. Lower current alleviates bottlenecks traditionally associated with power delivery, e.g. series inductance and resistance of package, socket, and circuit board traces.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A method comprising:

driving a plurality of bridge networks with commutating signals;

providing current from the plurality of bridge networks to an inductive element; and driving buffer circuits with signals having three transitions for each transition of the commutating signals, wherein the buffer circuits produce the commutating signals.

2. The method of claim 1 wherein providing current from the plurality of bridge networks further comprises providing various amounts of current from each of the plurality of bridge networks, wherein the various amounts are based, at least in part, on sizes of circuit elements within the plurality of bridge networks.

3. The method of claim 1 further comprising:

detecting a load current amount coupled to the inductive element; and controlling the plurality of bridge networks in response to the load current amount.

4. The method of claim 1 wherein a rate of the three transitions is determined in part by inductive elements coupled between the buffer circuits and the bridge networks.

5. The method of claim 1 wherein driving a buffer circuits with signals having three transitions for each transition of the commutating signals comprises driving input signals at third harmonics of resonant frequencies associated with the buffer circuits.

6. A method comprising:

driving an input of a buffer through three logic transitions to effect a single logic transition on an output of the buffer, wherein timing of the three logic transitions on the input are related to a rise time of the logic transition on the output; and clamping the output to a logic level after driving the input through three transitions.

7. The method of claim 6 wherein the timing of the three logic transitions on the input are related to a harmonic frequency of a resonant circuit coupled to the buffer.

8. The method of claim 6 wherein clamping the output comprises clamping the output to a high logic level.

9. The method of claim 6 wherein clamping the output comprises clamping the output to a low logic level.

10. An apparatus comprising:

an input port;

an output port;

a resonant circuit coupled to the output port;

an inverter coupled to drive the resonant circuit;

first and second clamp circuits coupled to the output port; and a timing circuit coupled between the input port and the inverter, and coupled between the input port and the first and second clamp circuits, the timing circuit to generate three signal transitions at an input of the inverter for each signal transition on the input port, and to cause the first and second clamp circuits to alternately clamp a voltage on the output node.

11. The apparatus of claim 10 wherein the resonant circuit comprises an inductive element.

12. The apparatus of claim 11 wherein the resonant circuit further comprises a capacitive load.

13. The apparatus of claim 10 wherein the inverter comprises complementary transistors driven separately by the timing circuit.

14. The apparatus of claim 10 wherein the first clamp circuit comprises a pullup transistor coupled between an upper power supply node and the output node.

15. The apparatus of claim 14 wherein the second clamp circuit comprises a pulldown transistor coupled between a lower power supply node and the output node.

16. An electronic system comprising:

a power converter including a plurality of resonant buffers configured to be driven at a third harmonic of a resonant frequency, and a plurality of bridge networks driven by the plurality of resonant buffers; and a processor coupled to the power converter.

17. The electronic system of claim 16 wherein the power converter and the processor are included on a single integrated circuit die.

18. The electronic system of claim 16 further comprising a plurality of resonant circuits coupled to output nodes of the plurality of resonant buffers, wherein the resonant frequency depends in part on the resonant circuits.

19. The electronic system of claim 18 wherein each of plurality of resonant circuits includes an inductive element coupled in series with the output node of the resonant buffer.

20. The electronic system of claim 16 wherein the plurality of bridge networks are configured to be individually enabled and disabled.

* * * * *

UNITED STATES PATENT AND TRADEMARK OFFICE
CERTIFICATE OF CORRECTION

PATENT NO. : 6,798,256 B1
DATED : September 28, 2004
INVENTOR(S) : Peter Hazucha, Gerhard Schrom and Jae-Hong Hahn It is certified that error appears in the above-identified patent and that said Letters Patent is hereby corrected as shown below:

Title page,
Item [56], References Cited, OTHER PUBLICATIONS,
"High Efficiency" reference, delete "Tehcnology" and insert -- Technology --, therefor.

Column 10,
Line 17, after "driving" delete "a".

Signed and Sealed this

Twenty-second Day of February, 2005

JON W. DUDAS
*Director of the United States Patent and Trademark Office*